(12) United States Patent
Clark et al.

(10) Patent No.: US 8,679,953 B1
(45) Date of Patent: Mar. 25, 2014

(54) CRYSTALLINE REO TEMPLATE ON SILICON SUBSTRATE

(71) Applicants: Andrew Clark, Los Altos, CA (US);
 Erdem Arkun, San Carlos, CA (US);
 Radek Roucka, Mountain View, CA (US)

(72) Inventors: Andrew Clark, Los Altos, CA (US);
 Erdem Arkun, San Carlos, CA (US);
 Radek Roucka, Mountain View, CA (US)

(73) Assignee: Translucent, Inc., Palo Alto, CA (US)

( * ) Notice: Subject to any disclaimer, the term of this patent is extended or adjusted under 35 U.S.C. 154(b) by 3 days.

(21) Appl. No.: 13/717,336

(22) Filed: Dec. 17, 2012

(51) Int. Cl.
 *H01L 21/00* (2006.01)
(52) U.S. Cl.
 USPC ................................ 438/478; 257/E21.09
(58) Field of Classification Search
 None
 See application file for complete search history.

(56) References Cited

U.S. PATENT DOCUMENTS 6,214,429 B1 * 4/2001 Zou et al. ................ 428/64.1
6,852,575 B2 * 2/2005 Bojarczuk et al. ........... 438/149

* cited by examiner

*Primary Examiner* — Matthew W Such
*Assistant Examiner* — Robert Carpenter
(74) *Attorney, Agent, or Firm* — Parsons & Goltry; Robert A. Parsons; Michael W. Goltry

(57) ABSTRACT

A method of forming a template on a silicon substrate includes the step of providing a single crystal silicon substrate having a protective layer of amorphous silicon oxide on an upper surface thereof. A working area is delineated on the upper surface of the silicon substrate and a rare earth metal oxide is formed on the upper surface of the silicon substrate within the working area. The rare earth metal oxide is crystal lattice matched to the upper surface of the silicon substrate to form a template for further operations and portions of the upper surface outside the working area are covered with the protective layer of amorphous silicon oxide.

4 Claims, 2 Drawing Sheets

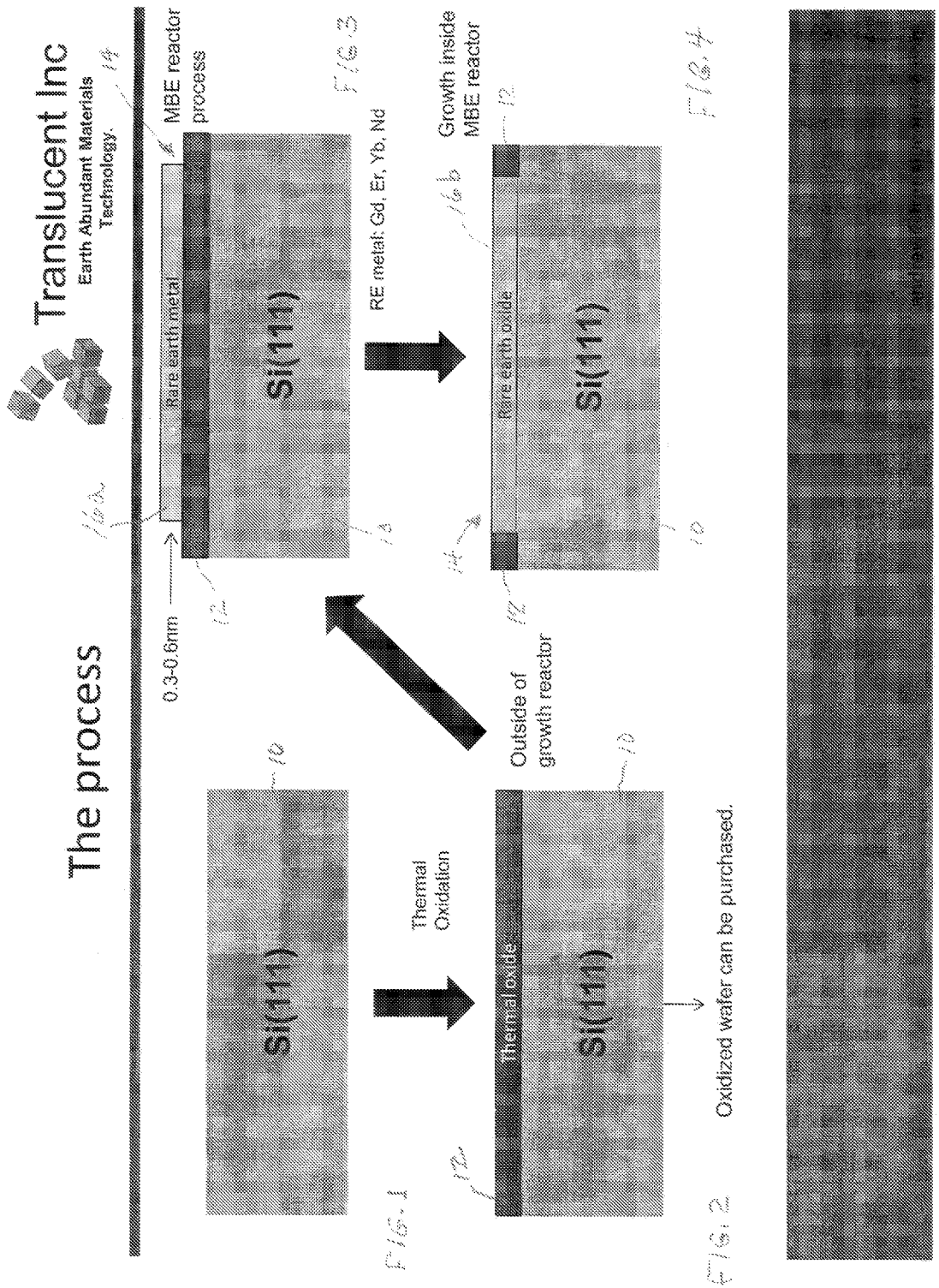

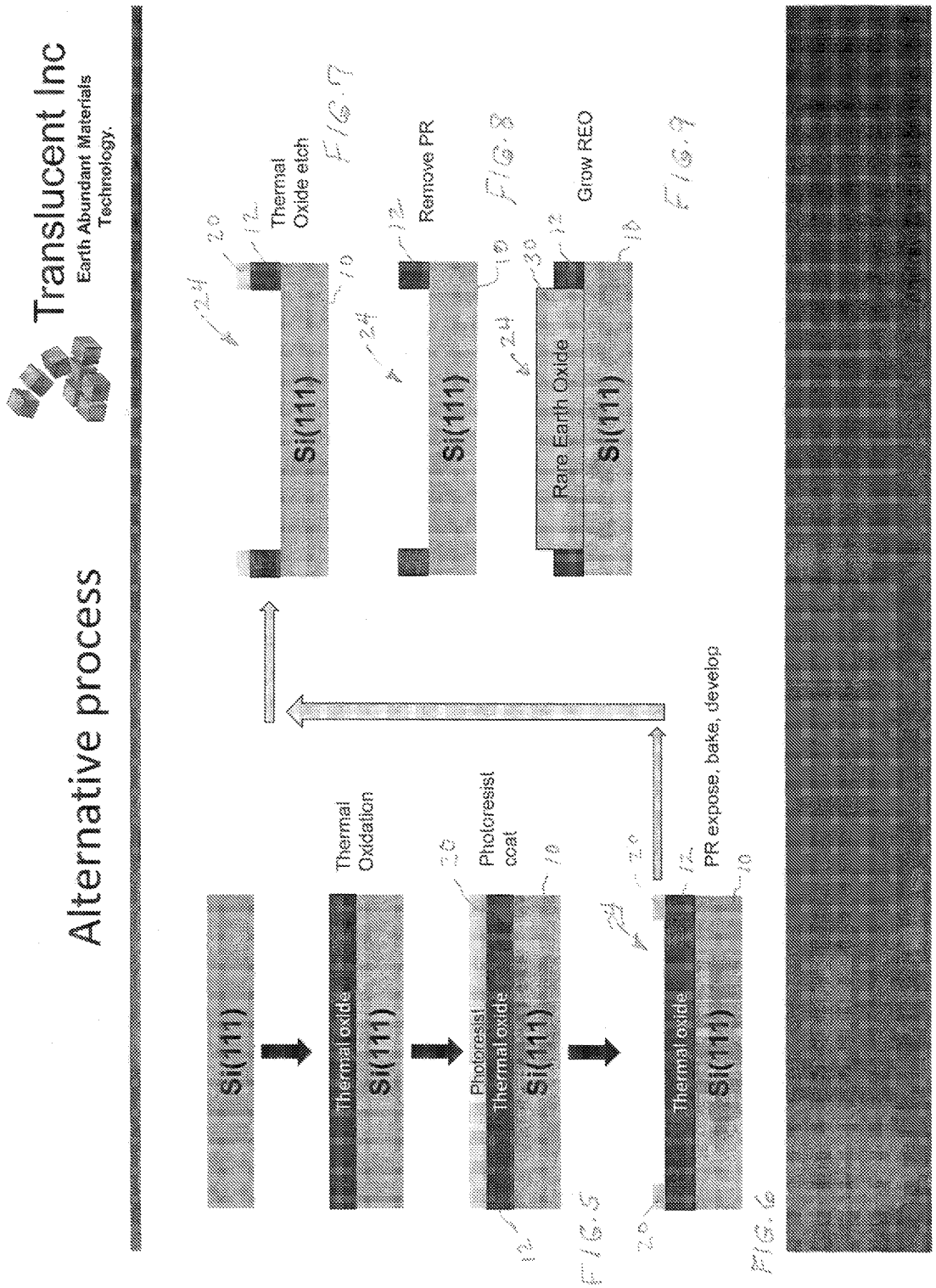

CRYSTALLINE REO TEMPLATE ON SILICON SUBSTRATE

FIELD OF THE INVENTION

This invention relates in general to the formation of a crystalline rare earth oxide template on a silicon substrate.

BACKGROUND OF THE INVENTION

In the semiconductor industry, it is known that growing a III-N material, such as GaN, on a silicon substrate is difficult due in large part to the large crystal lattice mismatch (−16.9%) between silicon and GaN. Thus, some type of template is generally formed on the silicon substrate and the III-N material is grown on the template. It is also known that during any of the growth process there must ideally be no exposed silicon surface due to detrimental reaction between the III-N material (e.g. Ga) and silicon. In the prior art a common process for protecting the silicon surface of a substrate (i.e. a wafer or portion thereof) is to grow an amorphous thermal oxide layer on the surface, for example by thermal oxidation of the surface. One problem is that the amorphous silicon oxide also prevents the direct growth of a crystalline III-N layer.

It would be highly advantageous, therefore, to remedy the foregoing and other deficiencies inherent in the prior art.

Accordingly, it is an object of the present invention to provide new and improved methods for the formation of a crystalline rare earth template on a silicon substrate.

It is another object of the present invention to provide new and improved methods for the conversion of an amorphous thermal oxide layer on the surface of a silicon substrate into a crystalline rare earth template for the subsequent growth of III-N areas.

SUMMARY OF THE INVENTION

Briefly, the desired objects and aspects of the instant invention are achieved in accordance with a preferred method of forming a template on a silicon substrate including a step of providing a single crystal silicon substrate having a protective layer of amorphous silicon oxide on an upper surface thereof. A working area is delineated on the upper surface of the silicon substrate and a rare earth metal oxide is formed on the upper surface of the silicon substrate within the working area. The rare earth metal oxide is crystal lattice matched to the upper surface of the silicon substrate to form a template for further operations and portions of the upper surface outside the working area are covered with the protective layer of amorphous silicon oxide.

The desired objects and aspects of the instant invention are achieved in accordance with a specific method of forming a template on a silicon substrate including the steps of providing a single crystal silicon substrate having a protective layer of amorphous silicon oxide on an upper surface thereof, delineating an area on the upper surface of the silicon substrate, and depositing a rare earth metal on the amorphous silicon oxide within the area. The rare earth metal reacts with the amorphous silicon oxide to form a layer of rare earth oxide crystal lattice matched to the upper surface of the silicon substrate with portions of the upper surface outside the area covered with the protective layer of amorphous silicon oxide.

The desired objects and aspects of the instant invention are also realized in accordance with a specific crystal lattice matched template on a silicon substrate. The template/substrate includes a single crystal silicon substrate having a protective layer of amorphous silicon oxide on at least portions of an upper surface thereof, a working area delineated on the upper surface of the silicon substrate, and a rare earth metal oxide on the upper surface of the silicon substrate within the working area. The rare earth metal oxide is crystal lattice matched to the upper surface of the silicon substrate with all portions of the upper surface outside the working area covered with the protective layer of amorphous silicon oxide.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIGS. 1-4 illustrate several steps in a process of forming a crystalline rare earth template on a silicon substrate, in accordance with the present invention; and FIGS. 5-9 illustrate several steps in another process of forming a crystalline rare earth template on a silicon substrate, in accordance with the present invention.

DETAILED DESCRIPTION OF THE DRAWINGS

Turning to FIGS. 1-4, simplified layer diagrams are illustrated showing several steps in a process of forming a crystalline rare earth template on a silicon substrate 10, in accordance with the present invention. Referring specifically to FIG. 1 in which silicon substrate 10 is illustrated, it will be understood that substrate 10 is or may be a standard well known single crystal wafer or portion thereof generally known and used in the semiconductor industry. Single crystal substrates, it will be understood, are not limited to any specific crystal orientation but could include <111> silicon, <110> silicon, <100> silicon or any other orientation or variation known and used in the art. The Si <100> and <111> substrates could also include various miscuts with nominal value between 0 and 10° in any direction.

Referring specifically to FIG. 2, silicon substrate 10 is illustrated with a layer 12 of amorphous silicon oxide formed on the surface thereof. Amorphous silicon oxide layer 12 is generally and most conveniently formed by a thermal oxidation process that is well known in the art. In fact, silicon substrates with a protective thermal oxide layer formed thereon are commercially available in the market. One major problem with silicon substrate 10 is that amorphous silicon oxide layer 12 renders it chemically inert.

Referring to FIG. 3, an area 14 of silicon substrate 10 is selected for further processing in, for example, the formation of an electronic device or the like. The further processing includes, generally, the deposition of a III-N material on or in which the electronic device is formed. However, as explained above, amorphous silicon oxide layer 12 renders silicon substrate 10 chemically inert.

To overcome this problem in accordance with the present invention, a working area 14 is first delineated as, for example, by masking or the like. A rare earth metal 16$a$, illustrated for convenience of understanding as layer, is then deposited in area 14. Throughout this disclosure whenever rare earth metals are mentioned it will be understood that "rare earth" metals are generally defined as any of the lanthanides as well as scandium and yttrium. It should also be noted that the crystal spacing (a) of rare earth metal is generally aREO~2aSi, i.e. "substantially matches silicon". Preferably, rare earth metal 16$a$ will have a crystal lattice spacing and structure that substantially matches silicon. Some examples of such rare earth metals are Gd, Er, Yb, and Nd. Also, the amount of rare earth metal deposited will depend to some extent upon the thickness of amorphous silicon oxide layer 12 but will generally lie within a range of 0.3 nm to 0.6 nm. Further, while the rare earth metal may be deposited by any of the well known processes in many applications, the preferred method is an MBE reactor process. It has been found that using the MBE process produces the highest quality buffer films, which is most desirable in the further processing steps.

Referring to FIG. 4, as growth of rare earth metal 16a occurs within the MBE reactor, the rare earth metal reacts with the oxide in amorphous silicon oxide layer 12 to form a layer 16b of rare earth oxide. The rare earth oxide of layer 16b is single crystal (mono-crystal or crystalline) material that is substantially crystal lattice matched to silicon substrate 10. Further, it is only present within area 14 so as to form a template for the further operation in the deposition of III-N material. Since the rare earth oxide of layer 16b is substantially crystal lattice matched to silicon substrate 10 a layer of III-N material or additional layers of crystal lattice matching material can be grown directly thereon and will be single crystal material suitable for the formation of electronic devices therein. Generally, when a silicon substrate is used with a crystal lattice matching template, the template is designed to be crystal lattice matched to the silicon substrate and to the III-N material. Thus the template may include more than one layer to aid in the epitaxial growth of high quality single crystal III material thereon. Also, amorphous silicon oxide layer 12 covers all areas not covered by the rare earth oxide of layer 16b so that no portions of silicon substrate 10 are exposed to the further operations.

Turning now to FIGS. 5-9, another or alternative process in accordance with the present invention is disclosed. Referring specifically to FIG. 5 and starting with the silicon substrate 10 protected by amorphous silicon oxide layer 12 as illustrated in FIG. 2, a photoresist coating 20 is applied to the upper surface. Photoresist coating 20 is exposed to a light source, baked, and developed in a well known masking process to delineate a working area 24 in which a portion of amorphous silicon oxide layer 12 is exposed as illustrated in FIG. 6. The exposed portion of amorphous silicon oxide layer 12 is etched in a well known process to expose the upper surface of silicon substrate 10 in area 24, as illustrated in FIG. 7. The remaining photoresist coating 20 is removed as illustrated in FIG. 8.

Once the steps illustrated in FIGS. 5-8 are completed, a layer 30 of rare earth oxide can be grown in area 24. The rare earth oxide of layer 30 is single crystal (mono-crystal or crystalline) material that is substantially crystal lattice matched to silicon substrate 10. Further, it is only present within area 24 so as to form a template for the further operation in the deposition of III-N material. Since amorphous silicon oxide layer 12 covers all areas not covered by rare earth oxide layer 30, no portions of silicon substrate 10 are exposed to the further operations.

Thus, new and improved methods for the formation of a crystalline rare earth template on a silicon substrate have been disclosed. The new and improved methods include the conversion of an amorphous thermal oxide layer on the surface of a silicon substrate into a crystalline rare earth template for the subsequent growth of III-N materials. In all cases the silicon substrate is protected from exposure to the process of depositing the III-N materials.

Various changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

The invention claimed is:

1. A method of forming a template on a silicon substrate comprising the steps of:
   providing a single crystal silicon substrate having a protective layer of amorphous silicon oxide on an upper surface thereof;
   delineating a working area on the upper surface of the silicon substrate, and
   forming a rare earth metal oxide on the upper surface of the silicon substrate within the working area including depositing a rare earth metal on the layer of amorphous silicon oxide within the working area using an MBE reactor process and including depositing approximately 0.3 nm to approximately 0.6 nm of rare earth metal, the step of depositing the rare earth metal including depositing one of Gd, Er, Yb, or Nd, the rare earth metal oxide being crystal lattice matched to the upper surface of the silicon substrate with portions of the upper surface outside the working area covered with the protective layer of amorphous silicon oxide.

2. A method of forming a template on a silicon substrate comprising the steps of:
   providing a single crystal silicon substrate having a protective layer of amorphous silicon oxide on an upper surface thereof;
   delineating an area on the upper surface of the silicon substrate, and
   depositing a rare earth metal on the amorphous silicon oxide within the area, the rare earth metal reacting with the amorphous silicon oxide to form a layer of rare earth oxide crystal lattice matched to the upper surface of the silicon substrate with portions of the upper surface outside the area covered with the protective layer of amorphous silicon oxide.

3. A method as claimed in claim 2 wherein the step of depositing the rare earth metal includes using an MBE reactor process.

4. A method as claimed in claim 2 wherein the step of depositing the rare earth metal includes depositing one of Gd, Er, Yb, or Nd.

* * * * *